United States Patent
Beyer et al.

(10) Patent No.: US 6,764,922 B2
(45) Date of Patent: Jul. 20, 2004

(54) METHOD OF FORMATION OF AN OXYNITRIDE SHALLOW TRENCH ISOLATION

(75) Inventors: Klaus D. Beyer, Poughkeepsie, NY (US); Fen F. Jamin, Wappingers Falls, NY (US); Patrick R. Varekamp, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/704,052

(22) Filed: Nov. 7, 2003

(65) Prior Publication Data

US 2004/0106267 A1 Jun. 3, 2004

Related U.S. Application Data

(60) Continuation of application No. 10/246,252, filed on Sep. 18, 2002, now Pat. No. 6,709,951, which is a division of application No. 09/863,980, filed on May 23, 2001, now Pat. No. 6,498,383.

(51) Int. Cl.$^7$ ............... H01L 21/336; H01L 21/331; H01L 21/76
(52) U.S. Cl. .............. 438/424; 438/294; 438/295; 438/297; 438/318; 438/353; 438/355; 438/359; 438/423; 438/425; 438/426; 438/427; 438/433; 438/435
(58) Field of Search .............. 438/294, 295, 438/297, 318, 353, 355, 359, 423, 424, 425, 426, 427, 433, 435

(56) References Cited

U.S. PATENT DOCUMENTS

| | | | |
|---|---|---|---|
| 4,113,515 A | 9/1978 | Kooi et al. | 148/1.5 |
| 5,596,218 A | 1/1997 | Soleimani et al. | 257/369 |
| 5,837,612 A * | 11/1998 | Ajuria et al. | 438/697 |
| 5,866,465 A | 2/1999 | Doan et al. | 438/424 |
| 5,968,842 A | 10/1999 | Hsio | 438/692 |
| 5,972,783 A | 10/1999 | Arai et al. | 438/513 |
| 6,037,018 A | 3/2000 | Jang et al. | 427/579 |
| 6,114,222 A | 9/2000 | Thakur | 438/471 |
| 6,127,242 A | 10/2000 | Batra et al. | 438/440 |
| 6,133,113 A | 10/2000 | Jenq et al. | 438/424 |
| 6,146,970 A | 11/2000 | Witek et al. | 438/424 |
| 6,150,072 A | 11/2000 | Shoda et al. | 430/313 |
| 6,221,735 B1 * | 4/2001 | Manley et al. | 438/426 |
| 6,258,676 B1 * | 7/2001 | Lee et al. | 438/296 |
| 6,355,540 B2 * | 3/2002 | Wu | 438/433 |
| 6,635,551 B2 * | 10/2003 | Aton | 438/424 |
| 2001/0014512 A1 * | 8/2001 | Lyons et al. | 438/424 |

OTHER PUBLICATIONS

International Technology Disclosures, entitled "2% Silane Plasma Enhanced CVD Dielectric Films", by J.P. Gallagher, et al, vol. 2, No. 2, Feb. 25, 1984.

* cited by examiner

Primary Examiner—John F. Niebling
Assistant Examiner—Stanetta Isaac
(74) Attorney, Agent, or Firm—John Jordan; Margaret A. Pepper

(57) ABSTRACT

An oxynitride material is used to form shallow trench isolation regions in an integrated circuit structure. The oxynitride may be used for both the trench liner and trench fill material. The oxynitride liner is formed by nitriding an initially formed oxide trench liner. The oxynitride trench fill material is formed by directly depositing a high density plasma (HDP) oxide mixture of $SiH_4$ and $O_2$ and adding a controlled amount of $NH_3$ to the plasma mixture. The resultant oxynitride structure is much more resistant to trench fill erosion by wet etch, for example, yet results in minimal stress to the surrounding silicon. To further reduce stress, the nitrogen concentration may be varied by varying the proportion of $O_2$ to $NH_3$ in the plasma mixture so that the nitrogen concentration is maximum at the top of the fill material.

13 Claims, 3 Drawing Sheets

METHOD OF FORMATION OF AN OXYNITRIDE SHALLOW TRENCH ISOLATION

The present application is a continuation application related to a copending U.S. Pat. application Ser. No. 10/246,252, filed Sep. 18, 2002 now U.S. Pat. No. 6,709,951 which application is a divisional application of Application Ser. No. 09/863,980 filed May 23, 2001, now U.S. Pat. No. 6,498,383.

BACKGROUND OF THE INVENTION

1. Field of the Invention

The present invention generally relates to semiconductor devices and, more particularly, to semiconductor device shallow trench isolation (STI) structures and methods of forming such structures using oxynitride as the trench fill material to inhibit STI etch erosion during fabrication.

2. Background and Related Art

As the critical dimension (CD) of the polysilicon gate of field effect transistors (FETs) is made smaller in order to increase the performance of the FET, greater control of the gate CD is required. The variation in the gate CDs across the entire chip, known as across-chip-linewidth-variation (ACLV), is a determining factor in the overall circuit speed.

The typical method for patterning the polysilicon gate in ultra large scale integrated (ULSI) circuits is to use photolithography with small wavelength light (248 nm or smaller). In order to control the photolithography process, an anti-reflective coating is typically spun onto the blanket polysilicon film before the photoresist is spun on. The thickness of the anti-reflective coating is optimized such that a minimum amount of light is reflected from the substrate wafer. If the anti-reflective coating thickness varies across the chip, then the amount of reflected light will vary, which results in a lack of control of the photolithography process. This lack of control results in a larger ACLV and reduced circuit performance.

One of the key contributors to anti-reflective coating thickness variation across the chip is the height of the shallow trench isolation (STI) material relative to the silicon active area where the devices are located. After the gate-level mask and photolithography tools are optimized and the polysilicon etch process is optimized, STI height variation will be one of the remaining contributors to increased ACLV.

In typical semiconductor device manufacturing processes, the STI region is composed of a pure oxide material, such as high density plasma (HDP) oxide or plasma tetraethyl orthosilicate (TEOS). Since the STI trench formation and STI fill processes are performed at the beginning of the chip manufacturing process, the STI oxide encounters many subsequent wet etch processing steps (e.g. with dilute HF or buffered HF) as well as dry etching steps (e.g. reactive ion etching (RIE)). Thus, as a normal part of the fabrication process leading to the final device, the STI oxide will be etched away. This leads to a change in the height of the STI oxide compared to the silicon active area each of which exhibit height changes as the silicon wafer proceeds through the chip manufacturing process.

Since there are many etch steps between STI formation and polysilicon deposition, and each etching step has its associated variabilities, there is often a lack of control over the amount of etching the STI actually undergoes. In wet chemical baths, for example, the HF concentration is known to change over the life of the bath. Also, depending of the application technique used to administer the HF, there may also be within-wafer variations of the etching rate. Similarly, RIE tools, which typically process one wafer at a time, have well-known across wafer variations and wafer-to-wafer variations.

One way to reduce the erosion of the STI region is simply to eliminate as many wet and dry etch steps as possible between STI formation and deposition. For example, elimination of the sacrificial oxidation and oxide strip steps used to condition the active area surface provides some simplification. However, this approach can only be taken so far, as some of these steps may be necessary to create the final circuit and achieve necessary yield. Another way to reduce STI erosion is to reduce the amount of exposure to chemical etchants in each of the required etch steps. Likewise this approach is problematic, since the etchant steps are often made intentionally long to remove particulates, remedy inconsistent oxide thicknesses or create hydrogen-terminated surfaces for subsequent processes.

Other efforts have been made to form caps over the STI material in order to inhibit STI erosion during subsequent etching steps used to form the active areas. For example, U.S. Pat. No. 6,146,970 to Witek, et al. describes the use of a silicon nitride or nitrogen-rich silicon oxynitride layer for capping an oxide STI material such as TEOS. However, the Witek, et al. bilayer approach adds significant cost and process complexity to the formation of STI. For example, Witek, et al. use two separate liner processes, two separate deposition processes and two separate CMP processes.

In this regard, acceptable solutions to the erosion of STI must be simple and cost-effective. In addition to exhibiting simplicity and low cost, acceptable solutions should have sufficient robustness such that it is unnecessary to constrain other process variables simply to control STI height. At the same time, such solutions must preferably fit within existing processes so as to avoid affecting product yield and cost.

SUMMARY OF THE PRESENT INVENTION

Accordingly, it is an object of the present invention to provide improved semiconductor device structures and methods for making same.

It is a further object of the present invention to provide improved STI for semiconductor devices, such as, FETs.

It is yet a further object of the present invention to provide improved STI structures for USLI semiconductor devices and methods for making such structures.

It is still yet a further object of the present invention to provide an improved STI structure and a simple process for fabricating same, which structure and process provide improved fabrication control and, thus, improved device performance.

It is another object of the present invention to provide improved STI structures and methods of making same so as to control STI erosion and the height of the STI material relative to the semiconductor active area.

In accordance with the present invention, the STI between the active areas of semiconductor devices is formed of various structural arrangements of oxynitride. The oxynitride may be used for both the trench liner and trench fill material. Introducing nitrogen into both the oxide liner and plasma oxide fill material permits convenient utilization of existing processes. The oxynitride STI is formed in a manner to minimize stress to the surrounding silicon, and yet acts to provide an STI structure that resists etch attack and erosion during the required fabrication steps subsequent to the STI deposition.

Since the use of oxynitrides for STI results in minimal trench fill erosion, such use allows close control of STI height relative to the silicon active area across the wafer, and from wafer-to-wafer. Initially, a trench oxide liner may be nitrided by annealing, for example, in a nitrogen ambient to form an oxynitride liner. Then, the oxynitride STI fill material may be deposited directly into the trench during formation of the trench plug by the addition of nitrogen into the STI SiO$_2$ plasma trench fill process. The nitrogen concentration may be varied dynamically during the trench fill process so as to taylor it to the overall process. Varying the nitrogen concentration so that the highest concentration exists toward the surface of the plug minimizes both plug erosion and stress to the surrounding silicon under the active area regions.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
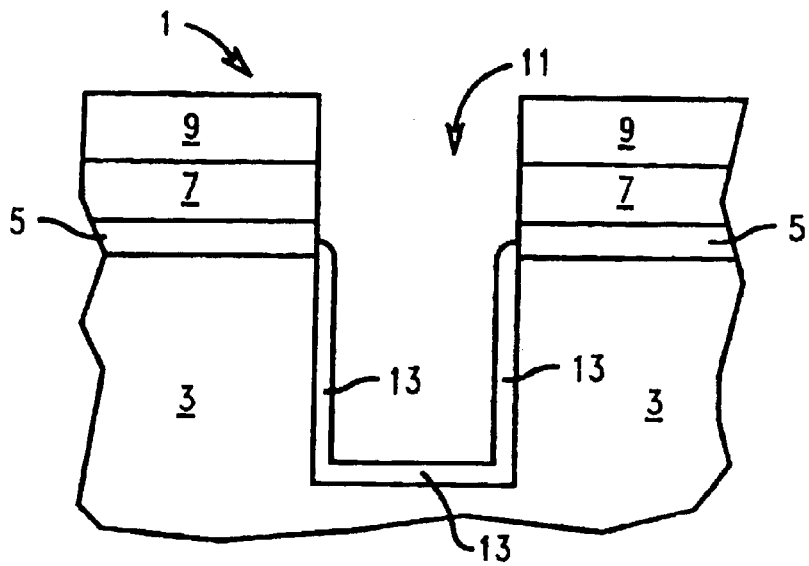
FIGS. 1–4 illustrate, in cross-sectional diagrams, the STI fabrication steps and resulting problem of trench fill erosion, as known in the prior art.

FIG. 1 illustrates a conventional semiconductor trench structure 1, as known in the prior art. In FIG. 1, a semiconductor substrate or semiconductor wafer 3 is provided. A pad oxide or thermal oxide layer 5 is formed over substrate 3. A thicker silicon nitride layer 7 is typically deposited on top of the thin oxide layer 5 to function as a hard mask. Then, the nitride layer is covered with photoresist 9. Conventional photolithographic processing is then used to etch an opening 11 through the silicon nitride layer 7 and the oxide layer 5 to expose a top surface portion of substrate 3. This opening in the dielectric layers 5 and 7 is then extended into the substrate by one or more RIE silicon etch steps to form STI region 11, as shown in FIG. 1. After formation of STI region 11, photoresist 9 is removed and a thermal oxidation process is utilized to form a thin oxide liner layer 13 on both the sidewalls and bottom surface of STI region 11, as shown in FIG. 1.

Figure 2:
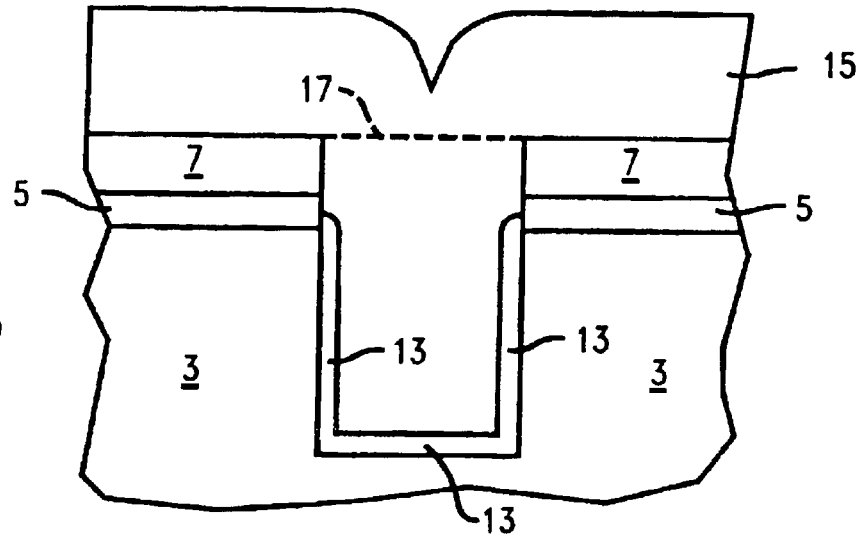

FIG. 2 illustrates conventional STI fill and polishing processes. The silicon dioxide STI fill material 15 is next conformally deposited over the substrate, filling trench 11. The substrate is then typically polished using a technique, such as chemical-mechanical polishing (CMP), to remove the excess STI fill material located above nitride layer 7. The surface of the substrate is now flat and, thus, the STI fill material is planar with the surface of nitride layer 7, as indicated by broken line 17.

Figure 3:
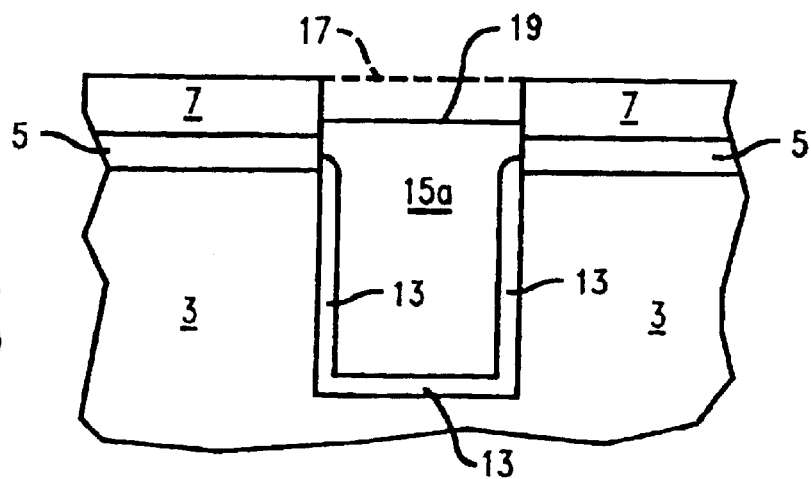

FIG. 3 illustrates the results of a conventional STI recess process. To implement this, the STI SiO$_2$ fill material is intentionally etched with a wet HF process or a dry RIE process in order to recess the oxide from the level of line 17, planar with the nitride, to level 19 below the nitride. The intended purpose of this is to set the initial height of the STI material such that, after the subsequent-manufacturing processing steps, the STI material will be, on average, planar with substrate 3 at the time of polysilicon deposition After the STI level is recessed, nitride layer 7 is removed, typically with a hot phosphoric wet etch. This results in substrate 3 being covered with oxide layer 5 and the STI oxide fill material forming an STI oxide plug 15a raised above the surface of oxide layer 5 to a level corresponding to line 19. The STI material 15 may then be annealed in an inert or oxidizing ambient with a furnace or rapid thermal process resulting in a densified plug 15a. This however, may be done at any point after deposition of the STI material or nitride removal.

Figure 4:
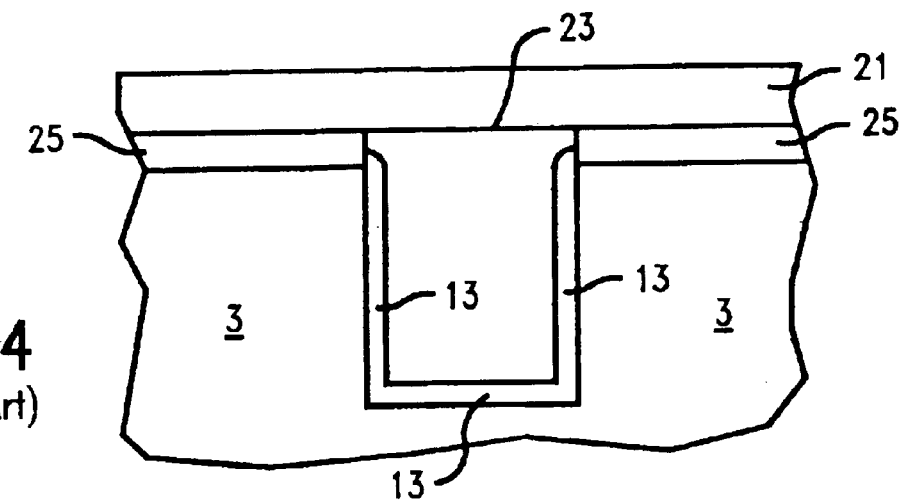

FIG. 4 illustrates the STI area at the time of deposition of polysilicon layer 21. Many processing steps occur between removal of nitride layer 7 and deposition of polysilicon layer 21 used for the FET gate. Since some of these processing steps involve dry and/or wet etching, the height of the STI oxide plug material is now at a level indicated by line 23. Since some of the processing steps involve thermal oxidations and/or SIO$_2$ depositions, the oxide layer 5 on top of substrate 3 is now a different oxide layer 25. Ideally, STI plug level 23 is planar with the surface of oxide layer 25 at the time polysilicon layer 21 is deposited. However, in practice this is quite difficult to achieve.

It should be understood that elements illustrated in the drawings are not necessarily drawn to scale but are merely provided to facilitate an understanding of the description. For example, the dimensions of some of the elements may,be exaggerated relative to other elements.

A detailed description of the features and advantages of the present invention will now be described with reference to FIGS. 5–8. The description and cross-sectional diagrams will demonstrate the similarities and points of departure between the STI structure and method of making such structure, in accordance with the present invention, and that used in the prior art. In overcoming the problem of trench fill erosion in STI material, it is advantageous, from both a cost and reliability standpoint, to use as many of the extant processing steps as possible.

Figure 5:
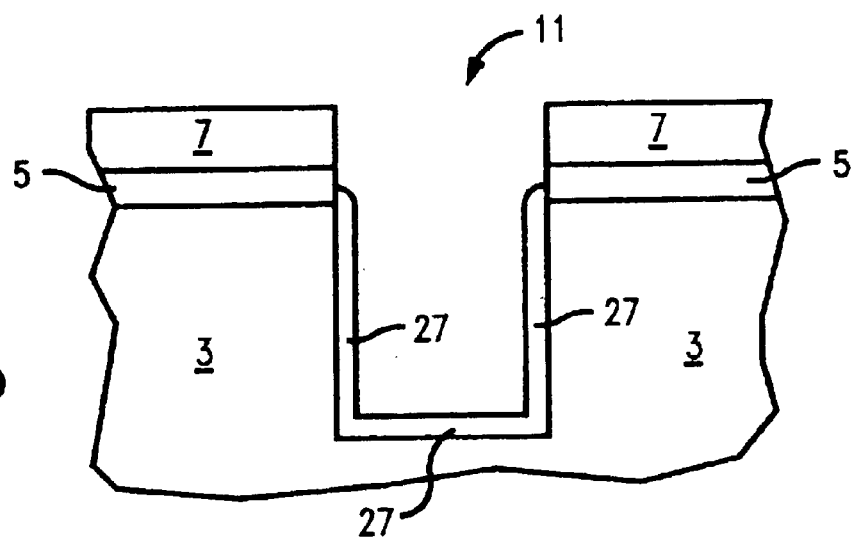
FIGS. 5–8 illustrate, in cross-sectional diagrams, the fabrication steps and resulting structure to overcome trench fill erosion, in accordance with the present invention.

With reference to FIG. 5, there is shown a cross-sectional view of a conventional semiconductor trench structure, similar to that shown in FIG. 1 but with photoresist layer 9 omitted The same reference characters are used in FIGS. 5–8 for those structural features which are the same as those shown in FIGS. 1–4. It should be understood that semiconductor substrate 3 may be any of a variety of substrates, such as, silicon, silicon-on-insulator, silicon germanium, etc.

Accordingly, FIG. 5 shows a substrate 3 covered with pad oxide layer 5 and silicon nitride layer 7 all of which material has a trench 11 formed therein. The process of forming an oxynitride STI structure, in accordance with the present invention, may begin with nitriding the trench oxide liner, which was identified as oxide liner 13 in FIGS. 1–4 and now is identified as oxynitride liner 27 in FIG. 5–8. This is done before any STI fill material is deposited in the trench. One advantage of nitriding the liner at this point in the process is that should the upper corners of trench 11 be exposed after STI formation but before polysilicon deposition, there is provided added protection of the corners from chemical etch attach This will result in a smaller "divot" at the semiconductor-STI interface due to chemical etching.

Since the oxide liner has a typical thickness of 30 Å–500 Å, one effective way of forming oxynitride liner 27 is by annealing the oxide liner in an N-containing ambient Thus, trench 11 with its initial oxide liner, as shown in FIG. 5, may be exposed to any one of N$_2$O, NO, NH$_3$ or N$_2$H$_4$, for example, at typical temperatures of between 500° C. and 1100° C. and pressures of between 1 mtorr and 10 atm. The choice of gas controls the amount of nitrogen incorporated into the liner, as well as the location of the nitrogen. For example, $N_2O$, NO and $NH_3$ will diffuse through the oxide layer and incorporate nitrogen at the silicon-$SiO_2$ interface, while $NH_3$ and $N_2H_4$ can also incorporate nitrogen at the $SiO_2$-atmosphere interface. In this regard $N_2O$ can only incorporate <1% nitrogen concentration ([N]) into the oxide, while NO, $NH_3$ and $NH_4$ can incorporate anywhere between 1% and 20% [N], depending upon the anneal temperature, pressure and time duration. The duration of gaseous exposure is optimized for the annealing tool design, as well us the desired raw process time.

Another way to convert the oxide liner into oxynitride liner 27 is with a plasma nitridation (PN) process. Such processes are usually characterized as either remote or direct. In remote plasma nitridation, the plasma is generated in an attached but separate chamber and then the excited species are convected into the chamber holding the wafer using an inert carrier gas. In direct plasma nitridation, the plasma is formed in the same chamber as the wafer in a background of an inert gas. Remote plasma nitridation has the advantage that less damage will be done to the wafer, since the energetic plasma species are confined to a separate chamber. However, direct plasma nitridation offers better control over the across-wafer [N], since the plasma can be designed to be uniform over the entire surface of the wafer. Both processes may incorporate between 1% and 20% [N], and in both cases the [N] tends to be located at the oxide-atmosphere surface since the excited nitrogen species tend to react before completely diffusing through the oxide layer. In both cases, the wafer temperature is typically held at a value between 20° C. and 800° C. during plasma processing, the chamber pressure is typically between 10 mtorr and 700 torr, and the source of nitrogen is typically molecular ($N_2$) or ammonia ($NH_3$).

One aspect common to each of the nitridation schemes discussed above is that the oxide liner will receive the same nitrogen-depth profile in the sidewall of the trench as in the bottom of the trench. In some cases it may be desirable to maximize [N] in oxynitride liner 27 at the top region of the sidewalls of trench 11 so that divot formation due to etch removal is further minimized while at the same time avoiding the additional stress at the bottom of the trench that would otherwise occur if it underwent the incremental [N] increase introduced at the top. The best way to accomplish this feature is to incorporate the additional nitrogen at the top region of oxynitride liner 27 via direct ion implantation with molecular or atomic nitrogen at a significant angle away from normal to the wafer surface. Typical implant angles may vary between 10 degrees and 45 degrees away from the normal. The angled ion implant may be performed in four separate steps by rotating the wafer 90 degrees between each implant. This results in a more even coverage of the nitrogen species and incorporated N into all sides of differently-oriented trench designs. Typical, atomic nitrogen doses vary between 1e 13 atoms/$cm^2$ and 5e15 atoms/$cm^2$, and result in a [N] of 1% to 20%. The ion implant energy must be tuned such that the majority of the implanted profile lies within the thin oxide (now oxynitride) liner. For an oxide layer between 30 Å and 500Å, typical implant energies are 500 e V to 50 ke V.

It is clear that the degree to which the ion implanted nitrogen extends from the substrate surface into the trench to implant liner 27 sidewalls is determined by ion implant angles, atomic nitrogen doses and implant energies. In this regard, it is preferred that this implant, and thus the increased [N], extend up to 500 Å of sidewall below the surface of substrate 3. As is understood by those skilled in the art, the ion implant angle, atomic nitrogen dose and implant energy may readily be selected to implant nitrogen in up to 500 Å of liner 27 sidewalls directly below the surface of the substrate, in addition to giving the desired increased [N].

It should be pointed out that regardless of how the nitrogen is incorporated into the oxide liner in FIG. 5, a further advantage of incorporation of nitrogen at this stage is that the device active areas are protected by nitride layer 7. Accordingly, there is little danger of impacting the yield or device properties of FETS, for example, formed on these surfaces, even while improving STI process.

After conversion of the oxide liner to oxynitride 27, the overall processes described above in regard to FIGS. 2–4 may be employed with appropriate modification. Although, a pure oxide STI fill plug may be formed inside of oxynitride liner 27 at this point, as noted above, this would not fully solve the STI erosion problem since a pure oxide plug would be easily eroded by subsequent wet or dry etch processes, leaving oxynitride liner 27 remaining.

Figure 6:
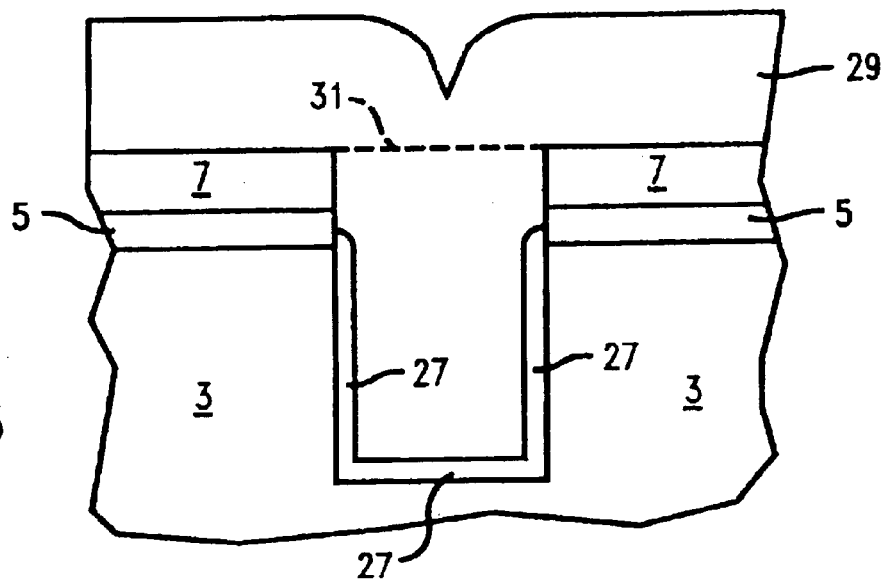

Accordingly, it is a feature of the present invention to overcome this erosion problem by forming an STI structure of oxynitride fill material and, further, to deposit this oxynitride STI fill material directly into the trench FIG. 6 illustrates that at the time of conventional STI trench fill material deposition, with appropriate additions, an oxynitride STI material could readily be deposited, instead of the normal oxide STI material. This is most effectively achieved by altering the oxide STI material deposition process. The typical STI material deposited at this point is a high density plasma (HDP) oxide created by a plasma mixture of $SiH_4$ and $O_2$. By adding a controlled amount of $NH_3$, for example, to the plasma mixture, an HDP oxynitride trench fill layer 29 with uniform [N] may readily be deposited, as shown in FIG. 6.

It should be noted that the proportion of $O_2$ to $NH_3$ in the plasma mixture may be varied dynamically during the deposition process in order to create STI fill material 29 with a varied or graded [N]. Typical gas flow ratios of $NH_3$ to $O_2$ may range between 0.1 and 10, whether the ratio is held constant during the process or varied dynamically. This range of flow ratios results in an oxynitride with a [N] between 3% and 25%. One advantage of varying or grading the [N] of the STI oxynitride fill material is to optimize the [N] benefits in the STI fill material while at the same time minimizing the stress created by the interaction of the fill material with substrate 3. In this regard, it is known that stoichiometric silicon nitride is not a good STI fill material since it creates large amounts of stress on the active area regions. Accordingly, to lessen any such effect here, to the degree it might exist, one may start the HDP deposition process with a low $NH_3$ to $O_2$ ratio, and then increase the ratio as the deposition progresses. Note that since trench depths are typically quite large (1000 Å to 6000 Å), other nitridation processes described herein would not be able to readily incorporate the high [N] in the STI fill material with the same degree of control as an oxynitride HDP deposition process.

Figure 7:
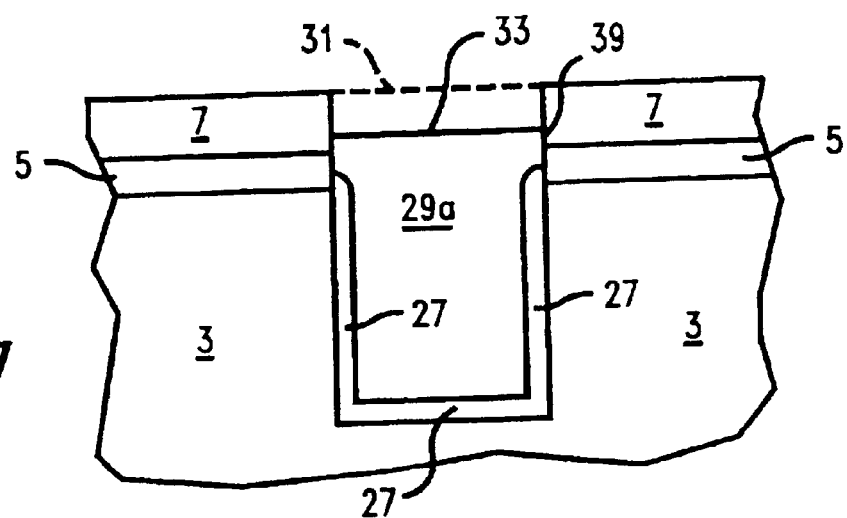

After deposition of oxynitride STI fill material 29 in FIG. 6, the fill material is subjected to a CMP process, for example, so as to produce a flat surface whereby the STI level 31, shown in FIG. 6, would be planar with the surface of the nitride layer 7, as shown in FIG. 7. This forms an oxynitride plug 29a. The typical CMP frictional endpoint technique employed in the prior art would work Well even with an oxynitride fill material, since stoichiometric silicon nitride still offers much more friction to the CMP pad than an oxynitride with 25% [N].

The next step in the oxynitride STI formation is to recess the STI height from the final CMP level 31 to the desired level 33, as shown in FIG. 7. A wet etch containing HF-EG (ethylene glycol) may be employed for this purpose. In this regard, ethylene glycol is known to etch oxides and nitrides at comparable rates, and the relative etch rate of oxide to nitride can be adjusted with bath temperature. Accordingly, although this form of recess process attacks nitride layer 7 as well as the oxynitride, since the purpose of nitride layer as a CMP stop has already been accomplished, its thickness is no longer important.

In any event, the oxynitride STI level 33 will be above the planar level of the substrate, since the final objective is to have the STI material planar with the substrate at the time of polysilicon deposition. Therefore, there will always be some nitride layer 7 material remaining after the ethylene glycol process.

It should be noted that the amount of desired recess between levels 31 and 33 in FIG. 7 will depend upon the [N] of the STI material. If the [N] is low, then the STI will still be eroded to some degree by subsequent wet and dry etch processes, and thus the amount of recess required will be relatively small. In the more typical and preferred approaches however, the [N] of the STI oxynitride material, especially at the top of the plug, would be high (close to 25% [N]) such that subsequent wet and dry etches would not significantly affect the height of the oxynitride STI. In these later approaches, it is clear that level 33 would be nearly planar with the surface of substrate 3. Accordingly, where [N] is high, there is only one etch process (the ethylene glycol recess process) that need be controlled within wafer, wafer-to-wafer and lot-to-lot, rather than several wet and dry etch processes.

To ensure a high [N] concentration at the top surface of oxynitride STI plug 29a, an additional plasma nitridation process may be employed after the recess process is complete. This nitridation process would typically have process parameters similar to those described above with respect to the description relative to FIG. 5.

Thus, by using the above-described parameters with respect to either the remote plasma nitridation or the direct plasma nitridation processes, an excited nitrogen species would be incorporated at the very top surface (within the top 50 Å) of the oxynitride STI plug 29a, as shown in FIG. 7. In addition, the plasma nitridation process may be complemented with a shallow nitrogen ion implant in order to place some additional amount of nitrogen species below the layer of nitrogen previously incorporated at the surface of the oxynitride STI plug 29a by either remote or direct plasma nitridation. This additional amount of nitrogen species further protects the oxynitride STI plug 29a from chemical attach from the side, should STI plug 29a be exposed some incremental amount above the substrate surface. For example, with nitride layer 7 etched away, sidewall portion 39 of plug 29a would be exposed to erosion It is clear that the depth of the shallow ion implant must be at least coextensive with the incremental amount of exposed plug above the substrate surface in order to ensure the most complete protection. The above nitridation processes should preferably be carried out while there is some residual nitride from nitride layer 7 remaining over the active areas. Such residual nitride would act to protect the active area from damage or material change which may affect the threshold voltage Vt of the final devices.

It is also clear that the overall amount of [N] in the oxynitride deposited in the trench will depend, to some extent, upon the type of circuit and device design employed in the active area. In this regard, some circuit and device designs are very sensitive to stress effects on the semiconductor material around the STI. Accordingly, such designs may necessitate employing an oxynitride with a [N] of 10% or less. Even at this [N] level however, the oxynitride exhibits a lower erosion rate than $SiO_2$. In addition, the [N] can be varied or graded, as hereinabove described, so that the top of the oxynitride plug exhibits the highest [N] which minimizes the amount of stress on the surrounding silicon while maximizing the ability to resist erosion at the top of the plug.

Where it is necessary, because of design considerations, to use an oxynitride STI plug with less than 10% [N], a higher [N] cap at the top surface of the oxynitride STI plug 29a may be formed. This may be done using a light plasma nitridation process. Since this process only incorporates nitrogen at the top surface of its target oxide layer 5 is sufficiently thick to still protect the active area regions from the nitrogen. However, since STI oxynitride plug 29a extends above the substrate surface, the plug sidewall portion 39 above the substrate surface is then exposed to chemical wet etch attach, for example.

Figure 8:
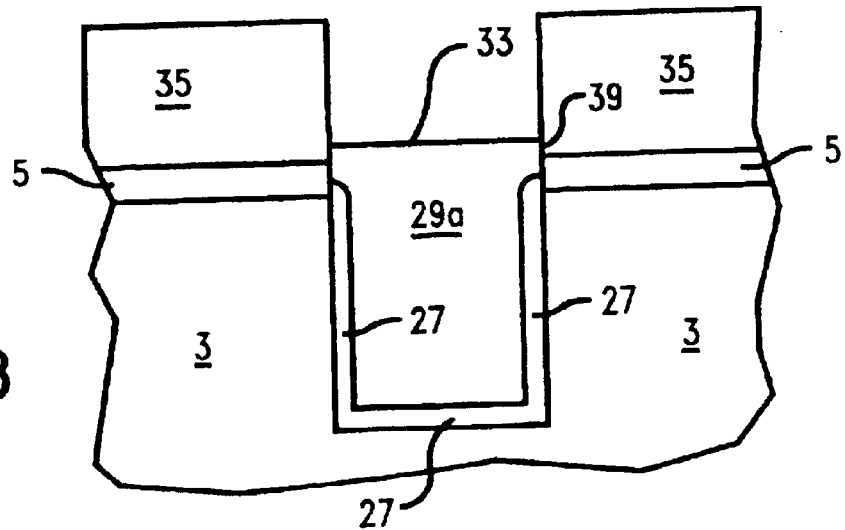

To protect the plug sidewall portion 39 from attack, additional steps may be employed to ion implant nitrogen into the sidewalls of the STI plug. This may be undertaken by applying resist layer 35 over oxide layer 5, as shown in FIG. 8. Then, as described above with respect to FIG. 5, nitrogen may be incorporated into the sidewalls of STI plug 29a by a direct ion implant with molecular or atomic nitrogen at significant angles away from normal to the substrate surface. Typical angles for such implant may vary between 10° and 45° from the normal. Again, the angled nitrogen is typically performed in four separate steps by rotating the wafer 90° between each implant. Typical atomic nitrogen may vary between 1 e 13 atoms/$cm^2$ and 5e 15 atoms/$cm^2$, and result in a [N] of between 1% and 20%. Typical implant energies would be between 500 eV and 50 keV.

After implanting increased nitrogen into sidewall 39 of STI plug 29a, resist layer 35 is removed. The extent of addition of [N] into the sidewalls is not critical so long as it is sufficient to resist erosion due to wet chemical etch attach. A region of [N] with a thickness of 50 Å to 100 Å into the sidewalls would be sufficient for this purpose.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for forming a semiconductor structure, comprising the steps of:
   providing a substrate;
   forming a trench region within said substrate;
   forming a trench liner region within said trench region; and
   filling said trench region with an oxynitride material, wherein the concentration of nitrogen within said oxynitride material is greater toward the top portion of said trench than toward the bottom portion of said trench.

2. The method as set forth in claim 1 wherein said step of filling comprises filling said trench region using a dense plasma oxide containing a controlled amount of said nitrogen.

3. The method as set forth in claim 2 wherein said nitrogen is in the form of a gas.

4. The method as set forth in claim 3 wherein said gas is $NH_3$ and the range of flow ratios of $NH_3$ to oxygen in said plasma mixture is 0.1 to 10.

5. The method as set forth in claim 4 wherein said ratio is varied to increase the nitrogen concentration in said plasma as the trench is filled with said oxynitride.

6. The method as set forth in claim 5 wherein said ratio is varied to increase the nitrogen concentration at the top portion of said trench.

7. The method as set forth in claim 6 wherein said step of forming a trench liner region comprises the steps of forming an oxide trench liner region and then nitriding said oxide trench liner region to form as oxynitride trench liner region.

8. The method as set forth in claim 7 wherein said step of nitriding the oxide trench liner region comprises annealing said oxide trench liner region in a nitrogen containing ambient.

9. The method as set forth in claim 7 wherein said step of nitriding the oxide trench liner comprises nitriding by plasma nitridation.

10. The method as set forth in claim 7 wherein said step of nitriding the oxide trench liner includes nitriding said oxide trench liner so as to form a higher nitrogen concentration in said liner region at the top of the trench sidewall than the nitrogen concentration in said liner region at the lower portion of said trench sidewall.

11. The method as set forth in claim 10 wherein said higher nitrogen concentration is formed by ion implant.

12. The method as set forth in claim 4 including the further steps of etching back said oxynitride material to form an oxynitride trench plug and then nitriding a layer of up to 50 Å at the surface of said oxynitride trench plug.

13. The method as set forth in claim 12 including the further step of ion implanting nitrogen below said layer of nitriding at the exposed surface of said oxynitride trench plug.

* * * * *